US012586983B1

(12) United States Patent
Krishnamurthy et al.

(10) Patent No.: US 12,586,983 B1
(45) Date of Patent: Mar. 24, 2026

(54) LASER DIODE HAVING BOWTIE-RIDGE WAVEGUIDE FOR HEAT-ASSISTED MAGNETIC RECORDING, AND RELATED APPARATUSES, DEVICES, SYSTEMS, AND METHODS

(71) Applicant: Seagate Technology LLC, Fremont, CA (US)

(72) Inventors: Vivek Krishnamurthy, Eden Prairie, MN (US); Supratim Basak, Londonderry (GB); Aidan Dominic Goggin, Donegal (IE)

(73) Assignee: Seagate Technology LLC, Fremont, CA (US)

(*) Notice: Subject to any disclaimer, the term of this patent is extended or adjusted under 35 U.S.C. 154(b) by 0 days.

(21) Appl. No.: 19/006,730

(22) Filed: Dec. 31, 2024

(51) Int. Cl.
| | |
|---|---|
| *H01S 5/10* | (2021.01) |
| *G11B 5/48* | (2006.01) |
| *H01S 5/065* | (2006.01) |
| *H01S 5/22* | (2006.01) |
| *G11B 5/00* | (2006.01) |

(52) U.S. Cl.
CPC .......... *H01S 5/1014* (2013.01); *G11B 5/4866* (2013.01); *H01S 5/0655* (2013.01); *H01S 5/22* (2013.01); *G11B 2005/0021* (2013.01)

(58) Field of Classification Search
CPC ..... G11B 5/54; G11B 5/58; G11B 2005/0021; G11B 5/00; G11B 5/09; G11B 11/10506; G11B 11/1051; G11B 7/125
USPC .......................................................... 360/59
See application file for complete search history.

(56) References Cited

U.S. PATENT DOCUMENTS

| | | | |
|---|---|---|---|
| 6,999,384 B2 * | 2/2006 | Stancil ................ | G11B 5/6088 |
| 8,223,597 B2 | 7/2012 | Komura et al. | |
| 8,405,932 B2 | 3/2013 | Seigler et al. | |
| 9,431,043 B2 | 8/2016 | Boone, Jr. et al. | |
| 9,576,595 B1 | 2/2017 | Hipwell, Jr. et al. | |
| 9,607,638 B1 | 3/2017 | Olson et al. | |
| 10,783,917 B1 | 9/2020 | Goggin et al. | |
| 11,120,830 B1 | 9/2021 | Goggin et al. | |
| 11,176,962 B1 | 11/2021 | Goggin et al. | |
| 11,328,744 B1 | 5/2022 | El Hallak et al. | |
| 11,823,708 B1 | 11/2023 | Krishnamurthy et al. | |
| 11,848,036 B1 | 12/2023 | Mehfuz et al. | |
| 12,087,338 B1 | 9/2024 | Harvey et al. | |

OTHER PUBLICATIONS

Brooks et al., "A New Design for Tapered-Geometry High-Power Semiconductor Optical Sources," Nov. 1996, *Conference Proceedings LEOS'96 9th Annual Meeting IEEE Lasers and Electro-Optics Society*, 2:207-208.
Brooks et al., "An Alternative Shape for Tapered Geometry Semiconductor Optical Sources," Jan. 2, 1998, *Proc. SPIE 3211, International Conference on Fiber Optics and Photonics: Selected Papers from Photonics India '96*, 3211:114-119.
Causa et al., "High Brightness Index-Guided Parabolic Bow-Tie Laser Arrays," Sep. 2004, *IEEE Photonics Technology Letters*, 16(9):2000-2002.

(Continued)

*Primary Examiner* — Nabil Z Hindi
(74) *Attorney, Agent, or Firm* — Mueting Raasch Group

(57) ABSTRACT

Single-transverse-mode laser diodes that include a bowtie-shaped ridge waveguide. Related apparatuses, data storage devices, computing systems, and methods.

20 Claims, 8 Drawing Sheets

(56)        References Cited

OTHER PUBLICATIONS

Kintzer et al., "High-Power, Strained-Layer Amplifiers and Lasers with Tapered Gain Regions," Jun. 1993, *IEEE Photonics Technology Letters*, 5(6):605-308.
Lang et al., "Numerical Analysis of Flared Semiconductor Laser Amplifiers," Jun. 1993, *IEEE Photonics Technology Letters*, 29(6):2044-2051.
Zhu et al., "High-Peak-Power Picosecond Optical Pulse Generation from Q-Switched Bow-Tie Laser with a Tapered Traveling Wave Amplifier," Apr. 1996, *IEEE Photonics Technology Letters*, 8(4):503-505.

* cited by examiner

LASER DIODE HAVING BOWTIE-RIDGE WAVEGUIDE FOR HEAT-ASSISTED MAGNETIC RECORDING, AND RELATED APPARATUSES, DEVICES, SYSTEMS, AND METHODS

BACKGROUND

The present disclosure relates to laser diodes that can be used in apparatuses such as HAMR read/write heads. There is a continuing need for laser diodes that can manage current density, optical density, and higher-order modes as demands for higher laser power with a relatively higher laser injection current ($I_{eff}$) grow.

SUMMARY

The present disclosure includes embodiments of a single-transverse-mode laser diode that includes a body. The body includes an active region and a bowtie-shaped ridge waveguide. The bowtie-shaped ridge waveguide is disposed in the body and configured to confine light generated in the active region and direct light toward a light-exit facet of the body. The body has a first facet and a second facet. The first facet and second facet are on opposite ends of the body. The second facet is the light-exit facet. The single-transverse-mode laser diode is configured to be coupled to an apparatus to communicate light from the light-exit fact of the laser diode to a near-field transducer in the apparatus.

BRIEF DESCRIPTION OF THE DRAWINGS

The discussion below references the following figures, wherein the same reference number may be used to identify the similar/same component in multiple figures. The schematic figures are for illustration purposes and are not necessarily drawn to scale.

DETAILED DESCRIPTION

The present disclosure relates to read/write heads used in heat-assisted magnetic recording (HAMR), also referred to as thermally-assisted recording (TAR), thermally-assisted magnetic recording (TAMR), energy-assisted magnetic recording (EAMR), etc. In this disclosure the terms "read/write head," "slider," "recording head," and "head" are used interchangeably. In a HAMR device, a read/write head includes an energy source (e.g., a laser diode) that heats a recording medium during writing. The HAMR read/write head has an optical transmission path that includes a waveguide and near-field transducer, which shape and direct the energy from the energy source to the recording medium.

Laser on Slider (LOS) read/write heads and On-Wafer Laser (OWL) read/write heads use two different approaches for coupling a single-transverse-mode laser diode (also referred to herein as a "laser diode") with read/write heads of hard disk drives, specifically for use in Heat-Assisted Magnetic Recording (HAMR) technology. Both involve the use of laser diodes to heat the magnetic, recording media during the writing process to allow for higher data storage densities. LOS involves directly mounting the laser diode onto the slider of the read/write head, while OWL fabricates the laser diode on a separate (source or donor) substrate (wafer) and transfers it to the slider or target substrate (wafer), before further processing the target substrate to integrate each laser diode into a corresponding read/write head and form individual read/write heads.

Figure 1:
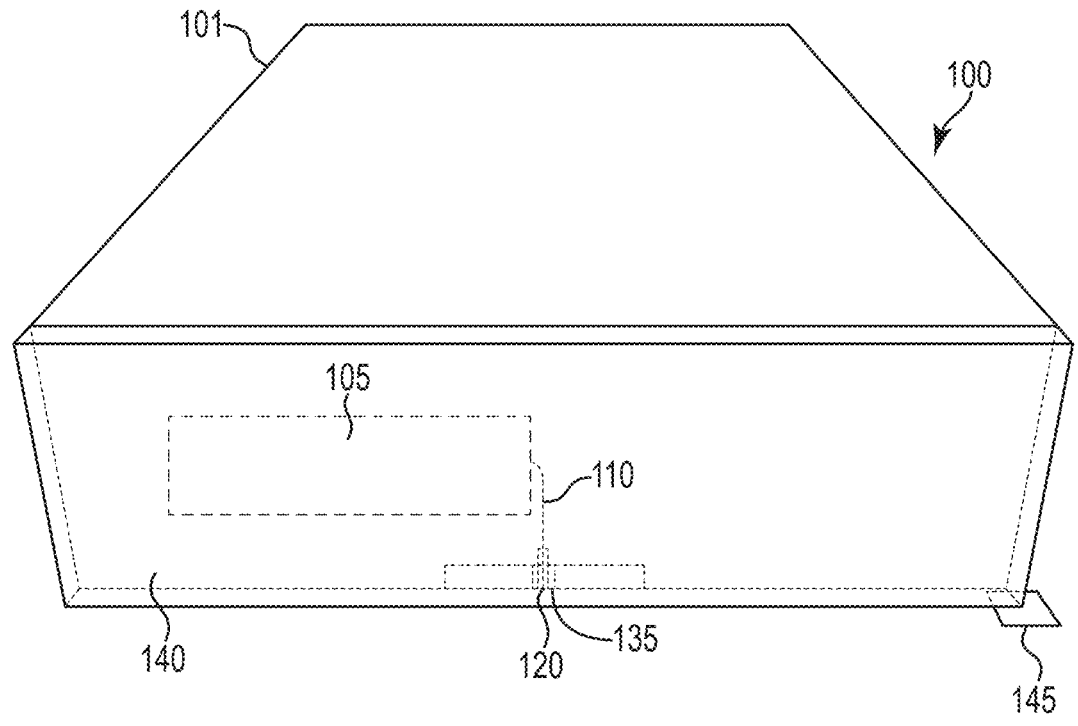
FIG. 1 is a perspective view of a read/write head having an integrated single-transverse-mode laser diode as an On-Wafer Laser (OWL) in accordance with embodiments described herein.
Figure 1:
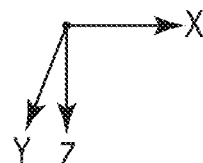

A non-limiting example of an apparatus that includes a laser diode according to the present disclosure is illustrated as apparatus 100 in FIG. 1, which is a heat-assisted magnetic recording read/write head having an On-Wafer Laser (OWL).

As used herein, the direction along x-axis is referred to as the cross-track direction; the direction along the y-axis is referred to as the down-track direction; and the direction along the z-axis is referred to as the media-facing direction. In more detail, the cross-track direction is perpendicular to the tracks on a magnetic recording medium that underlies and rotates relative to a HAMR read/write head. The cross-track direction is aligned with the lateral movement of the HAMR read/write head if it switched from writing (or reading) on one track to another. The down-track direction is parallel to the tracks on the magnetic recording medium and aligned with the rotational motion of the magnetic recording medium. Referring to trailing edge surface 140 in FIG. 1, a magnetic recording medium rotates in a direction from the front of apparatus 100 (which is opposite to the trailing edge surface 140) to the trailing edge surface 140. The media-facing direction points from apparatus 100 (HAMR read/write head) toward the surface of an underlying magnetic recording medium that faces the media-facing surface 145 (also referred to as air-bearing surface (ABS).

Apparatus 100 includes a substrate 101 and a laser diode 105 located on the substrate 101. A near-field transducer 120

(NFT) is located on the substrate 101 and is optically coupled to the laser diode 105 to receive light from the laser diode 105. In the embodiment shown in FIG. 1, a coupler and a waveguide 110 are disposed between the laser diode 105 and the near-field transducer 120 to help communicate light from laser diode 105 to near-field transducer 120.

During operation, the laser diode 105 produces light that is delivered to a region proximate a HAMR read/write transducer 135, which is located near the media-facing surface 145. The media-facing surface 145 faces and is held proximate to the moving surface or recording media (not shown) while reading and writing to the recording media. The media-facing surface 145 may be configured as an air-bearing surface (ABS) that maintains separation from the media surface via a thin layer of air. The energy is used to heat the recording media as it passes by the read/write transducer 135. Optical coupling components, such as a coupler and waveguide 110, are formed integrally within the substrate 101 (also referred to as slider body), which is near a trailing edge surface 140 as shown, and functions as an optical path that delivers energy from the laser diode 105 to the recording media via the near-field transducer 120. The near-field transducer 120 is located near the read/write transducer 135 and causes heating of the recording media during recording operations. The near-field transducer 120 may be made from plasmonic materials such as gold, silver, copper, etc.

Laser diodes like laser diode 105 include a ridge waveguide (not shown) disposed in the body and configured to confine light generated in the active region and direct light toward a light-exit facet of the body of the laser diode into the apparatus 100 (HAMR read/write head). Such waveguides are located in the upper cladding of the body and can have a constant width of about 2 micrometers along the entire length (longest dimension) of the laser. For HAMR writer designs it is expected that the demand will continue to grow for higher laser power with a relatively higher laser injection current ($I_{eff}$) for writing to a disk. A problem with using constant-width ridge waveguides in the context of HAMR read/write heads is that a higher $I_{eff}$ tends to result in a higher current density and higher optical density. Higher current density can contribute to localized heating along the length of the laser diode that can lead to dark line defects and decrease reliability of the laser diode. Higher optical density at the facets can lead to facet failure, which can also decrease reliability of the laser diode. Optical and current densities are a function of the cross-sectional area of the ridge waveguide through which the current flows. While the width of the ridge waveguide could be made wider along the entire length of the ridge waveguide to increase the cross-sectional area through which the current flows, this approach risks exciting higher-order modes that can be detrimental to HAMR operation. Also, while the length of the ridge waveguide could be made longer to increase the cross-sectional area through which the current flows, this approach is constrained because of the limited "real estate" available in HAMR read/write heads.

According to one aspect of the present disclosure, a bowtie-shaped ridge waveguide can be used in a laser diode of a HAMR read/write head. As discussed in detail below, a "bowtie-shaped ridge waveguide" includes a constriction region disposed between two tapered regions to form a bowtie shape. Each tapered region permits the cross-sectional area of the waveguide to be increased for a given length, thereby decreasing both the optical density at the facets and the current density. At the same time, having a relatively narrow section (the constriction region) between the two tapered regions filters out higher order modes to avoid what is referred to as a "kink" issue. A "kink" in a laser diode occurs when higher-order transverse modes begin to lase or interfere with the fundamental mode at higher drive currents. This causes instability in the laser's output, leading to non-linearities or "kinks" in the output power versus current (P-I) curve. Advantageously, using a bowtie configuration for a ridge waveguide can improve both operational performance and reliability, especially as laser injection current ($I_{eff}$) demands increase.

Figures 2A, 2B:
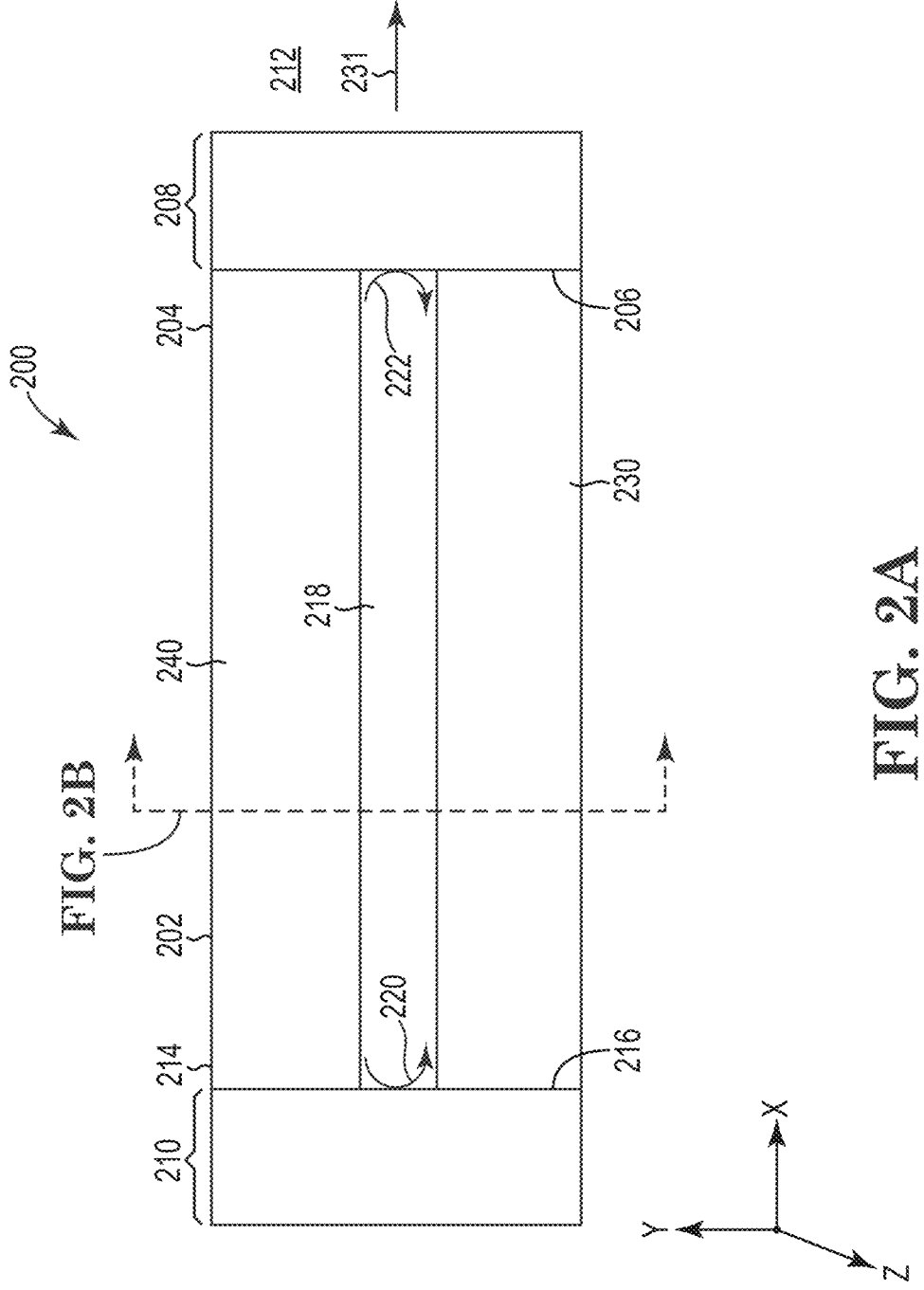
FIG. 2A is a partial, schematic bottom view, of an embodiment of a single-transverse-mode laser diode in component form.
FIG. 2B is a schematic cross-sectional, elevation view that includes the partial view of the single-transverse-mode laser diode shown the FIG. 2A taken along section line 2B-2B, which shows a bowtie-shaped ridge waveguide according to the present disclosure.
Figure 2B:
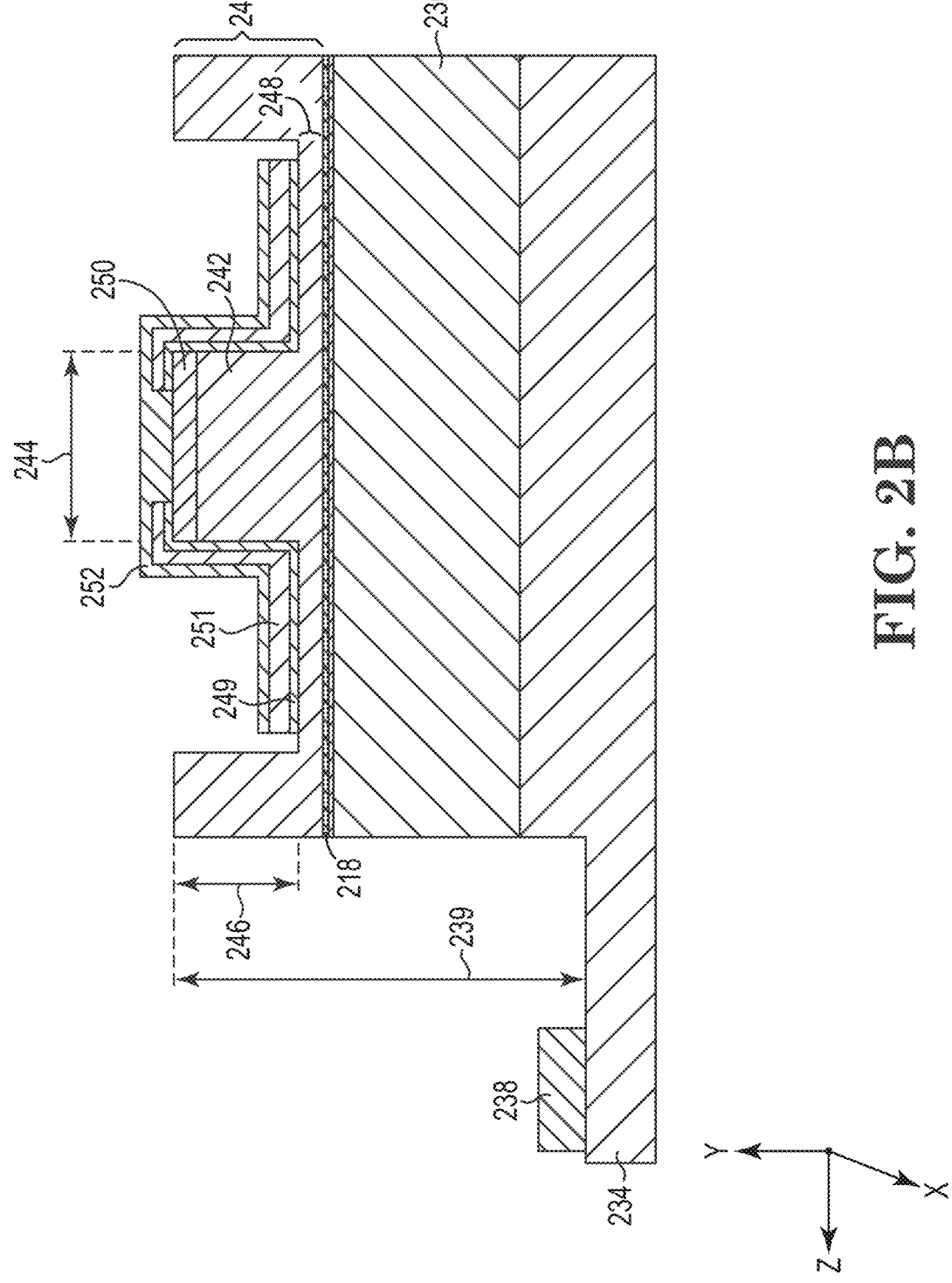
Figure 2C:
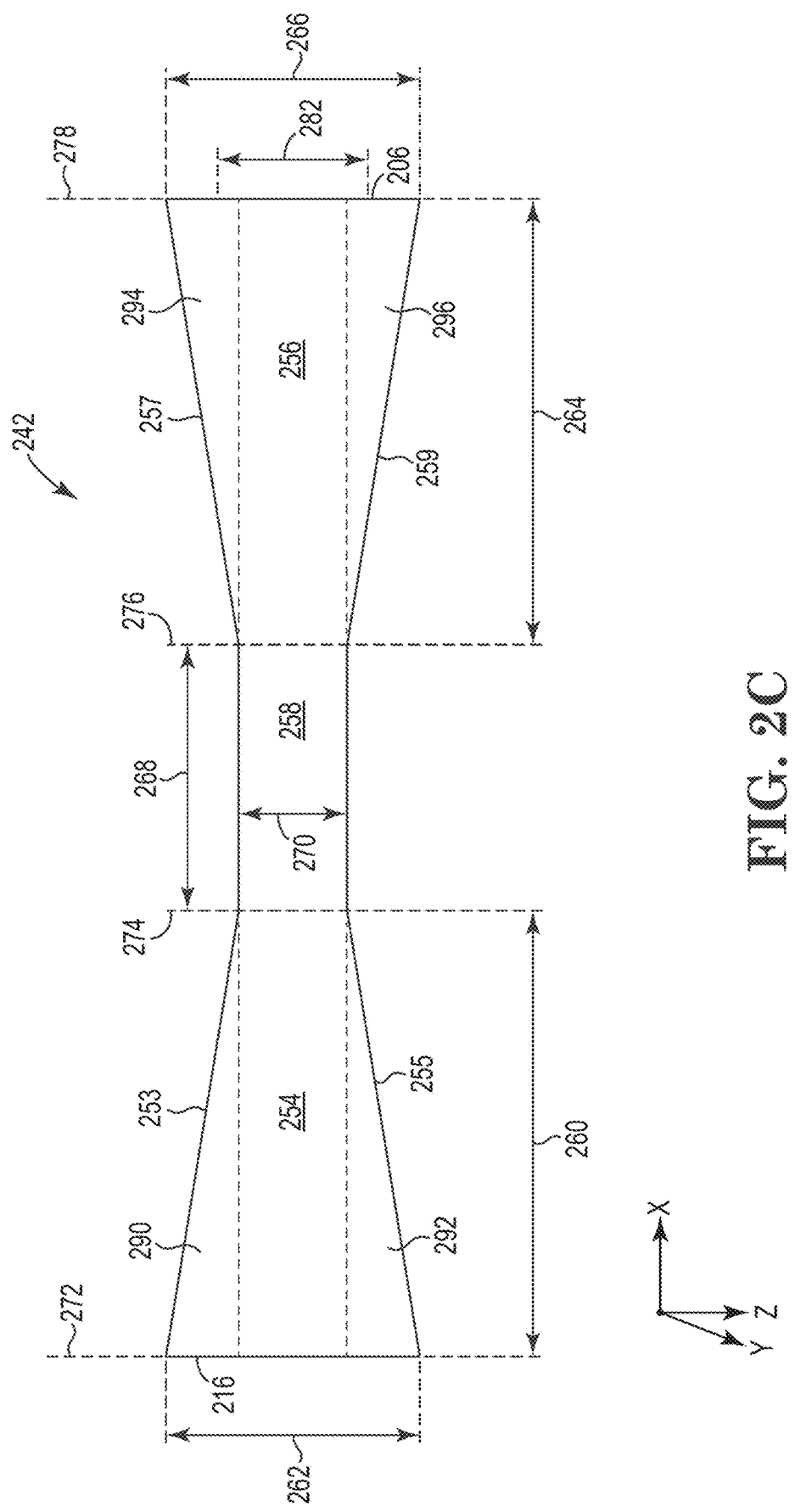
FIG. 2C is an isolated, top view of the bowtie-shaped ridge waveguide shown in FIG. 2B with the rest of the single-transverse-mode laser diode removed.

A non-limiting example of a single-transverse-mode laser diode having a bowtie-shaped ridge waveguide according to the present disclosure will be illustrated with respect to FIGS. 2A, 2B, and 2C.

As mentioned above, a single-transverse-mode laser diode is also referred to herein as a "laser diode." A single-transverse-mode laser diode refers to a laser diode that emits light in a well-defined spatial mode so that the laser beam is highly focused and coherent, which facilitates a precise and consistent light source to couple the light to the slider and NFT to heat a recording medium and enable high-density data storage. Single-transverse-mode diodes are configured to emit light in the fundamental transverse mode (often referred to as the $TE_{00}$ mode), producing a Gaussian beam profile (intensity profile). Also, for HAMR, single-transverse-mode diodes are configured to have a power output to heat the recording medium without undue losses. In some embodiments, single-transverse-mode diodes are configured to have a power output of 200 milliwatts or less, or even 100 milliwatts or less. In some embodiments, single-transverse-mode diodes are configured to have a power output from 5 to 100 milliwatts, or even from 10 to 50 milliwatts.

Referring to FIG. 2A, a single-transverse-mode laser diode is shown as laser diode 200 having a body 202, mirror structure 208 at the front, and mirror structure 210 at the back.

Body 202 includes one or more non-self-supporting layers of crystalline material, (e.g., not a separately packaged device) but is physically transferred to a target read/write head substrate that does contain already or will contain, after further processing, the other components of the read/write head (e.g., write coil and poles, reader stack) without the use of a separate or intermediate support during attachment.

As shown in FIG. 2A, body 202 includes active region 218, n-type cladding layer 230 "below" active region 218, p-type cladding layer 240 on "top" of active region 218, light-exit facet 206 at the front end 204, and a back facet 216 at the back end 214, which is on the opposite end of body 202 as compared to the front end 204.

The active region 218, or gain medium, is where light generation occurs through the process of stimulated emission. The active region of a laser diode is formed by a process known as epitaxial growth, where layers of semiconductor materials are deposited onto a substrate (e.g., substrate 300 discussed below) via molecular beam epitaxy (MBE) or metal-organic chemical vapor deposition (MOCVD). These layers form a p-n junction that constitutes the active region.

The active region of a laser diode is made from semiconductor materials, often from the III-V groups of the periodic table. These materials are selected for their ability to efficiently support electron-hole recombination, which generates photons (light) through the process of stimulated emission. The materials selected for the active region can depend on the desired wavelength of the laser and the specific application. For example, single-transverse-mode laser diodes for H AMR read/write heads are configured to operate in the near-infrared region from 800 nm to 1000 nm. Non-limiting examples of materials used to form the active region include gallium arsenide (GaAs) and alloys thereof (e.g., indium gallium arsenide (InGaAs) and aluminum gallium arsenide (AlGaAs)); indium phosphide (InP) and alloys thereof (e.g., indium gallium arsenide phosphide (InGaAsP)); gallium nitride (GaN) and alloys thereof (e.g., indium gallium nitride (InGaN) and indium gallium nitride (InGaN)); aluminum gallium indium phosphide (AlGaInP); and zinc selenide (ZnSe).

The active region is surrounded by other materials that serve optical and electrical functions, such as guiding light and injecting charge carriers. The cladding layers surround the active region and have a lower refractive index than the active region to create total internal reflection and confine light to propagate within the active region. Layers of cladding can be placed above and below the active region to confine the light within the active region 218. The selection of materials and formation techniques can depend on the specifications of the laser and the requirements for integration within a read/write head. Cladding layers in read/write heads can be grown around the active region using epitaxial growth methods, such as molecular beam epitaxy (MBE), or deposited through processes like sputtering or chemical vapor deposition (CVD) (e.g., metal-organic chemical vapor deposition (MOCVD)). Non-limiting examples of materials for cladding layers include aluminum gallium arsenide (AiGaAs), gallium arsenide (GaAs), indium phosphide (InP), silicon dioxide ($SiO_2$), aluminum oxide; $Al_2O_3$), and combinations thereof.

The cladding layers of a laser diode often include "p-type" (or "p-doped") and "n-type" (or "n-doped") layers in the laser diode. The p-type and n-type cladding layers are electrically active, forming part of the laser diode's structure to facilitate electron-hole recombination in the active region. N-doping and p-doping are methods used to modify the electrical properties of semiconductor materials by introducing impurities to form n-type cladding layers and p-type cladding layers, respectively. The impurities, known as "dopants," increase the concentration of free charge carriers, thereby enhancing the conductivity of the semiconductor material. N-doping introduces atoms with more valence electrons than the semiconductor material that is being doped. The "extra" electrons can move freely, contributing to electrical conductivity. Non-limiting examples of n-dopants include silicon, tellurium, sulfur, selenium, combinations of these, and the like.

The n-type cladding layers are located "below" the active region, and the p-type cladding layers are located "above" the active region. Referring to FIGS. 2A and 2B, active region 218 is surrounded by n-type cladding layer 230 and p-type cladding layer 240.

The p-type cladding layer also includes a ridge waveguide. The ridge waveguide is a structural feature etched into the p-type cladding layer. The ridge waveguide creates a narrow, elevated path in the p-doped cladding layer, guiding the current and restricting the optical mode laterally. The ridge waveguide provides lateral optical confinement, complementing the vertical confinement provided by the cladding layers. A ridge waveguide helps maintain single-transverse-mode operation by suppressing higher-order lateral modes. As mentioned above, the present disclosure includes a "bowtie-shaped ridge waveguide" that includes a constriction region disposed between two tapered regions.

Referring to FIGS. 2B and 2C, laser diode 200 includes bowtie-shaped ridge waveguide 242 disposed in the body 202 and configured to confine light generated in the active region 218 and direct light toward light-exit facet 206 of the body 202. Referring to FIG. 2B, bowtie-shaped ridge waveguide 242 is etched into p-type cladding layer 240 to a depth 246 leaving a residual thickness 248 in p-type cladding layer 240. Depth 239 corresponds to the height of the facets. Referring to FIG. 2B, in some embodiments, the bowtie-shape of the bowtie-shaped ridge waveguide can extend further in the negative down-track direction ("y" direction) through residual thickness 248 of p-type cladding layers, one or more active layers of active region 218, one or more n-type cladding layers, and/or one or more n-type substrate layers.

Bowtie-shaped ridge waveguide 242 includes a constriction region 258 disposed between tapered region 254 and tapered region 256. Each tapered region permits the cross-sectional area of the waveguide to be increased for a given length, thereby decreasing both the optical density at the facets and the current density. For example, referring to FIG. 2C, if a waveguide had a constant width 270 along its entire length (indicated by dotted lines) between light-exit facet and back facet, then the bowtie-shaped ridge waveguide 242 increases its area by triangle area 290 and triangle area 292 in first tapered region 254, and by triangle area 294 and triangle area 296 in second tapered region 256.

In more detail, tapered region 254 includes sides 253 and 255 (or etched sidewalls) that taper linearly from the back facet 216 toward the constriction region 258 from plane 272 to plane 274. Alternatively, one or both of sides 253 and 255 could taper curvilinearly (e.g., parabolically). Similarly, as shown in FIG. 2C, tapered region 256 includes sides 257 and 259 (or etched sidewalls) that taper linearly from the light-exit facet 206 toward the constriction region 258 from plane 278 to plane 276. Alternatively, one or both of sides 257 and 259 could taper curvilinearly (e.g., parabolically). As can be seen, the structural features of the bowtie-shaped ridge waveguide 242 such as length, wide, and the like are with reference to back facet 216 and light-exit facet 206, and a top view of the ridge waveguide 242 shown in FIG. 2B.

Tapered region 254 has a length 260 that extends between planes 272 and 274, and tapered region 256 has a length 264 that extends between planes 276 and 278. In some embodiments, at least one tapered region has a length of 300 microns or less, 150 microns or less, 120 microns or less, 100 microns or less, 95 microns or less, or even 90 microns or less. In some embodiments, at least one tapered region has a length from 20 to 100 microns, from 30 to 100 microns, or even from 50 to 100 microns. In some embodiments, at least one tapered region has a length of 20 microns or more, or even 30 microns or more.

Tapered region 254 has a maximum width 262 at back facet 216, and tapered region 256 has a maximum width 266 at light-exit facet 206. In some embodiments, at least one tapered region has a maximum width of 10 microns or less, 8 microns or less, 6 microns or less, 5 microns or less, or even 4 microns or less. In some embodiments, a tapered region has a maximum width from 3 to 10 microns, or even from 3 to 8 microns. It is noted that tapered region 254 has an intermediate width 244 at a location between planes 272 and 274.

Bowtie-shaped ridge waveguide 242 has an overall length between plane 272 and plane 278. In some embodiments, bowtie-shaped ridge waveguide 242 has an overall length of 350 microns or less, 300 microns or less, 250 microns or less, or even 220 microns or less. In some embodiments, bowtie-shaped ridge waveguide 242 has an overall length from 200 to 350 microns, or even from 200 to 250 microns.

It is noted that although the tapered regions 254 and 256 are illustrated as symmetrical to form a "bowtie" shape, they could have different lengths and/or widths from each other and still be considered a bowtie shape according to the present disclosure.

Referring to FIG. 2C, the total cross-sectional area ("x" direction times "z" direction) of bowtie-shaped ridge waveguide 242 is the sum of the cross-sectional areas of the tapered region 254, tapered region 256, and constriction region 258. In some embodiments, the total cross-sectional area ("x" direction times "z" direction) of bowtie-shaped ridge waveguide 242 can range from 350 microns$^2$ to 2500 microns$^2$, from 500 microns$^2$ to 1500 microns$^2$, from 600 microns$^2$ to 1500 microns$^2$, or even from 650 microns$^2$ to 1000 microns$^2$ As mentioned above, bowtie-shaped ridge waveguide 242 also has a constriction region 258. By having a relatively narrow section (the constriction region) between the two tapered regions, the constriction region functions to filter out higher-order modes.

Constriction region 258 has a width 270 between planes 274 and 276. As shown in the embodiment illustrated in FIG. 2C, width 270 is constant between planes 274 and 276. In some embodiments, constriction region 258 has a width 270 of 5 microns or less, 2 microns or less, 1.8 microns or less, 1.6 microns or less, or even 1.4 microns or less. In some embodiments, constriction region 258 has a width 270 from 0.5 to 5 microns, from 1 to 3 microns, or even from 1 to 1.8 microns.

Constriction region 258 also has a length 268 between planes 274 and 276. In some embodiments, constriction region 258 has a length 268 from 0 to 50 microns, from greater than 0 to 30 microns, or even from greater than 0 to 25 microns.

As shown in FIG. 2C, an emission aperture of a single-transverse-mode laser diode at the light-exit facet 206 of a has a width 282. In some embodiments, the width 282 of an emission aperture is from 0.5 to 5 microns, or even from 1 to 2 microns. In some embodiments, the width 282 of an emission aperture of 10 microns or less, 5 microns or less, or even 3 microns or less.

A single-transverse-mode laser diode also includes at least one contact layer. A contact layer refers to a doped layer that is located between a cladding layer and an electrode contact to enhance electrical contact. Referring to FIG. 2B, laser diode 200 includes a p-type contact layer 250 located between and in contact with p-type cladding layer 240 and p-side electrode contact 252 (discussed below). Non-limiting examples of materials for p-type contact layer 250 include aluminum gallium arsenide (AiGaAs), gallium arsenide (GaAs), indium gallium phosphide (InGaP), and combinations thereof. A p-type contact layer can be formed doping with one or more impurities such as zinc, magnesium, beryllium, carbon, tellurium, and combinations thereof.

A single-transverse-mode laser diode also includes at least one n-type substrate, which refers to a foundational layer upon which the rest of the laser diode structure is built. The n-type substrate provides structural stability and serves as the base for the epitaxial growth of subsequent layers (active region, cladding, etc.). The n-type substrate also facilitates good electrical conduction to the n-side (bottom) electrode, enabling current flow through the laser diode like p-type contact layer 250 discussed above. An n-type substrate can also help dissipate heat efficiently to help reduce the risk of overheating and improve the longevity of the laser diode. Non-limiting examples of material used to make an n-type substrate include gallium arsenide (AlGaAs), gallium arsenide (GaAs), indium phosphide (InP), and combinations thereof. A substrate can be doped to form an n-type substrate using impurities such as silicon, tellurium, and the like, for electrical conductivity. An n-side substrate can be a bulk crystal material that is sliced from a large, high-purity, single-crystal ingot and polished to serve as a base material. The lattice structure of the n-type substrate ensures proper alignment and growth of subsequent epitaxial-grown layers. Referring to FIG. 2B, laser diode includes n-type substrate 234.

A single-transverse-mode laser diode also includes electrode contacts that provide electrical power to the laser diode by injecting current into the active region. Non-limiting examples of materials that the electrode contacts can be made of include a metal chosen from gold, titanium, aluminum, nickel, platinum, and combinations thereof. Referring to FIG. 2B, laser diode 200 includes a p-side electrode contact 252 (top electrode contact) and an n-side electrode contact 238 (bottom electrode contact). The p-side electrode contact 252 is positioned above the p-doped cladding layer. The n-side electrode contact 238 is located on the top surface of a "ledge" or "patio" of the n-type substrate 234 that is adjacent to the body 202. The n-side electrode contact provides a pathway for current flow and form an electrical connection with the n-doped cladding layer. Together, the p-side electrode contact 252 and the n-side electrode contact 238 enable control of current injection for stable lasing operation and power output and wavelength stability. In some embodiments, a single-transverse-mode laser diode can include one or more passivation layers. Referring to FIG. 2B, laser diode 200 includes passivation layer 249 and passivation layer 251. A passivation layer can, e.g., reduce current heating effects at etched surfaces. A passivation layer can be made of, for example, a nitride and/or an oxide. Non-limiting examples of passivating layers include silicon-di-oxide, aluminum oxide, silicon nitride, combinations of these, and the like.

Laser diode 200 shown in FIG. 2B is formed by etching through multiple steps utilizing photolithography and hard masks, along selected crystal planes to create flat, smooth facets, such as back facet 216 and light-exit facet 206, and the overall three-dimensional shape of the body 202. Hard masks are made from relatively durable material like silicon dioxide (SiO$_2$) or silicon nitride (Si$_3$N$_4$), which facilitates more controlled etching. Hard masks can provide better resistance to aggressive etching processes. Non-limiting examples of etching include dry-etching techniques such as plasma etching and/or an ion-beam etching. Plasma etching involves generating a plasma (ionized gas) to create reactive species that chemically or physically removes material from the surface. In the case of a mirror coating on a laser diode, plasma etching can be used to achieve precise material removal. Ion-beam etching (IBE) uses a directed beam of ions to physically sputter or remove material from a surface. This technique is highly directional and allows for controlled etching of thin films, making it suitable for achieving smooth, uniform mirror coatings or adjusting their thickness in laser diodes.

In some embodiments, additional techniques can be used to shape or modify the facets.

As mentioned above, laser diode 200 includes light-exit facet 206, which can be referred to as an emitting mirror having a relatively lower reflectivity 222 as compared to the reflectivity 220 at the back facet 216 to allow light 231 to escape, thereby forming laser diode 200 output for an apparatus such as read/write head. For a laser diode to work properly, specific conditions are met to achieve lasing, which is the process by which coherent light is generated through stimulated emission. For example, a laser diode relies on a threshold amount of reflected light for lasing. Further, HAMR read/write heads rely on relatively high reflectivity at the rear end (back end) of the laser diode and a relatively lower reflectivity at the light-exit end (front end) of the laser diode so that light can exit for writing operations.

Reflectivity refers to the fraction of light that is reflected off a surface when it encounters a boundary between two materials. The reflectivity at a surface depends on the difference in refractive indices of the two materials at the boundary. The larger the difference, the higher the reflectivity tends to be. Reflectivity can be calculated from the refractive index and the incidence angle using the Fresnel equations, which for normal incidence corresponds to:

$$R_0 = \left[\frac{n1 - n2}{n1 + n2}\right]^2,$$

where $R_0$ is the reflectivity, $n_1$ is the refractive index of a first material, and $n_2$ is the refractive index of a second material that is different from the first material.

A mirror structure 208 is present on (over) and adjacent to the light-exit facet 206. Mirror structure 208 can include one or more layers (coatings) of dielectric material so that the mirror structure has a reflectivity 222 into the active region. It is noted that mirror structure 208 is illustrated in FIG. 2A as a single layer, but it is intended to represent one or a plurality of layers.

Non-limiting examples of dielectric material for a layer in a mirror structure 208 include an oxide, a nitride, and combinations thereof. For example, one or more layers in a mirror structure 208 can be made of silicon dioxide, silicon oxynitride, silicon nitride, aluminum oxide, tantalum oxide, titanium oxide, tantalum oxide, niobium oxide, and combinations thereof.

In some embodiments, the thickness of each layer in a mirror structure 208 is from 50 nanometers (nm) to 300 nm, or even from 50 nm to 190 nm.

Referring to FIG. 2A, a mirror structure 210 is present on (over) and adjacent to back facet 216 so that back facet 216 has a relatively high reflectivity 220 to help confine and reflect light back into the active region 218 of the laser diode 200, contributing to the amplification of light.

A mirror structure 210 can include one or more layers (coatings) such as high-reflectivity dielectric coatings, distributed Bragg reflector (DBR) stacks, and/or metallic layers. It is noted that mirror structure 210 is illustrated in FIG. 2A as a single layer, but it is intended to represent one or a plurality of layers.

High-reflectivity (HR) dielectric coatings are designed to reflect most of the laser light back into the active region, effectively increasing the laser diode's output at the opposite (front, light-exit) facet. These coatings may include one or more dielectric layers to create a reflective "stack" that provides a high reflectivity for the laser's operational wavelength.

DBRs are commonly used in high-reflectivity stacks. They include multiple layers with thicknesses (e.g., set at a quarter of the laser wavelength). This structure reinforces reflection through constructive interference, enhancing the HR coating's reflectivity. DBRs are made of materials such as GaAs and AlGaAs, Laser diode 200 is shown in laser diode-component form. As can be seen, the laser diode 200 has not yet been integrated into an apparatus such as a read-write head meaning that the space 212 adjacent to the mirror structure 208, and the space adjacent to the left of mirror structure 210 is air or vacuum, not apparatus material like dielectric material such as substrate 101 in FIG. 1. Another non-limiting example of "laser diode-component form" is during fabrication on a wafer like discussed below in FIG. 3. The plurality of laser diodes 302 on substrate 300 are considered in "laser diode-component form" because air or vacuum would be present adjacent to the outermost layer of both mirror structures 210 and 208.

FIG. 1 illustrates a non-limiting example of a laser diode integrated into an apparatus. As can be seen, instead of the space adjacent to the outermost layers of mirror structures 210 and 208 in FIG. 2A, substrate 101 is adjacent to and encapsulates the outermost layers of mirror structures in laser diode 105. Substrate 101 includes non-mirror structure material (encapsulation material) such as dielectric material, which encapsulates the laser diode 105. Non limiting examples of dielectric material for substrate 101 include silicon dioxide, silicon nitride, aluminum oxide, and combinations thereof.

A laser diode is configured to be integrated into the apparatus to direct light from the light-exit fact of the laser diode to a waveguide in the apparatus. For example, as shown in FIG. 1 and discussed above, a laser diode can be coupled to or integrated into an apparatus 100 such as a HAMR read/write head. An example of fabricating HAMR read/write heads with on-wafer lasers having a mirror structure according to the present disclosure is illustrated in FIGS. 3 to 7.

Figures 3, 4, 5, 6, 7:
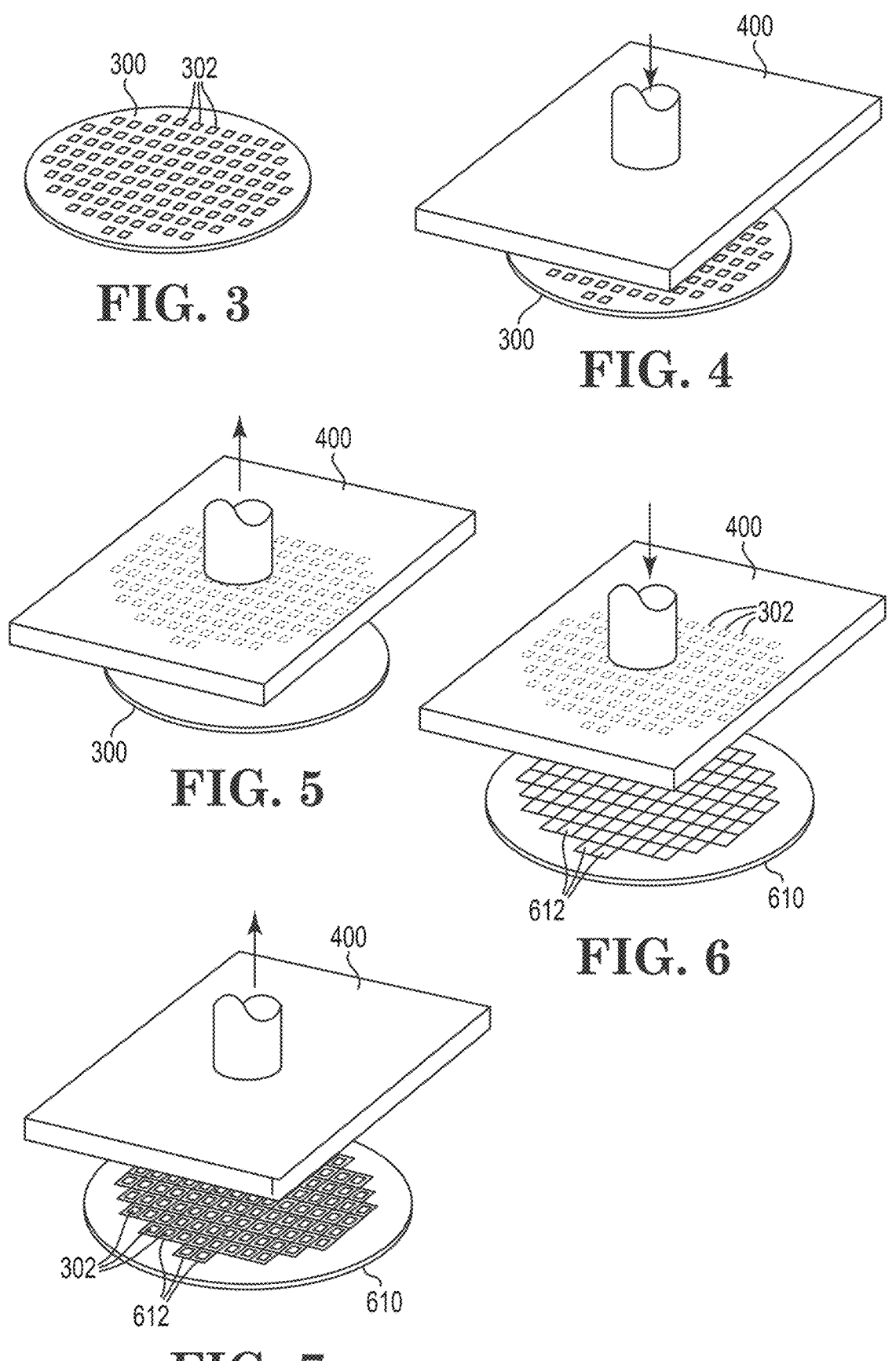
FIG. 3 is a perspective drawing showing a source substrate with a plurality of laser diodes.
FIG. 4 is a perspective drawing showing the transfer print head moving to "pick" the plurality of laser diodes from the source substrate shown in FIG. 3.
FIG. 5 is a perspective drawing showing the transfer print head of FIG. 4 lifting the "picked" plurality of laser diodes.
FIG. 6 is a perspective drawing showing the transfer print head moving to "print" the "picked" plurality of laser diodes from FIG. 5 to a source substrate.
FIG. 7 is a perspective drawing showing the transfer print head of FIG. 6 moving away from the "printed" plurality of laser diodes.

In FIG. 3, a donor or source substrate 300 is shown as a wafer that includes a plurality of laser diodes 302, such as laser diode 200, that were formed/fabricated on the substrate 300 via, e.g., epitaxial growth, photolithography, etching, deposition, and the like. If desired, a sacrificial (release) layer may be included between the laser diodes 302 and the substrate 300 to allow separation.

As shown in FIG. 4, a transfer print head 400 is lowered to contact the laser diodes 302 with sufficient pressure to temporarily "grip" the laser diodes via a handling layer (e.g., a soft material like polydimethylsiloxane, PDMS) to gently pick up the released laser diodes from the source substrate 300 or wafer without damaging them.

The transfer print head 400 is lifted as shown in FIG. 5, taking the laser diodes 302 with it. In this way, the laser diodes 302 are then transferred to a target substrate 610 as shown in FIGS. 6 and 7 via transfer printing.

As seen in FIG. 6, the transfer print head 400 is lowered over a target substrate 610 or wafer that includes a number of partially-processed, read/write heads 612. The transfer print head 400 presses the laser diodes 302 on to the target substrate 610 and is then moved away as seen in FIG. 7 to transfer each of the laser diodes 302 to a corresponding read/write head. Afterwards, the substrate 610 is further processed, e.g., depositing additional layers of material to form the remaining read/write head components. A non-limiting example of further processing includes encapsulating each laser diode on each read/write head to integrate each laser diode into each read/write head, followed by dicing individual read/write heads to separate them from the target substrate 610.

An apparatus that includes a laser diode having a bowtie-shaped ridge waveguide according to the present disclosure can be used in a data storage device such as a hard disk drive.

Figure 8A:
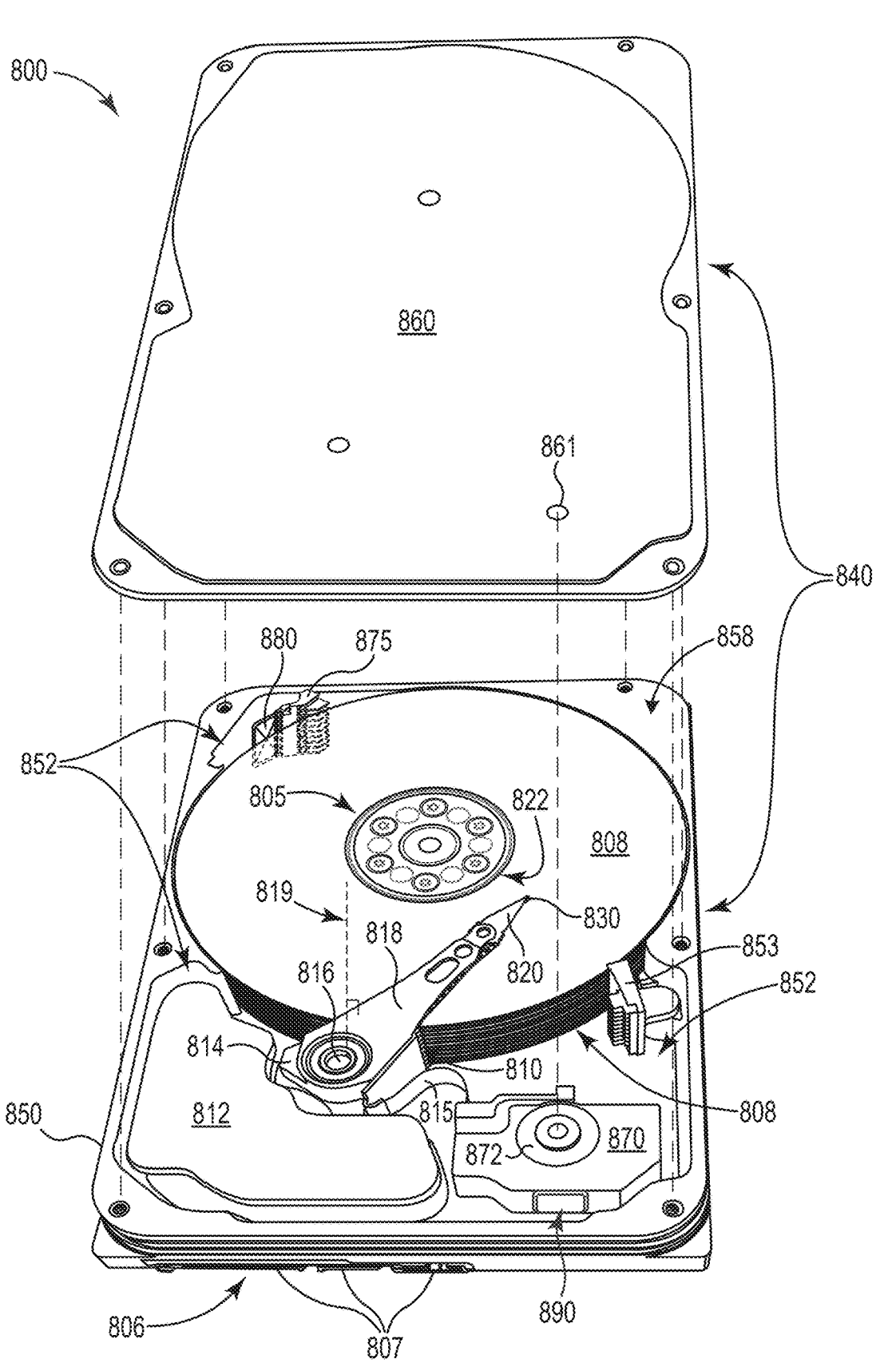
FIG. 8A is an exploded, perspective view of an example of a hard-disk drive that may include a read/write head having a laser diode with a mirror structure according to the present disclosure.
Figure 8B:
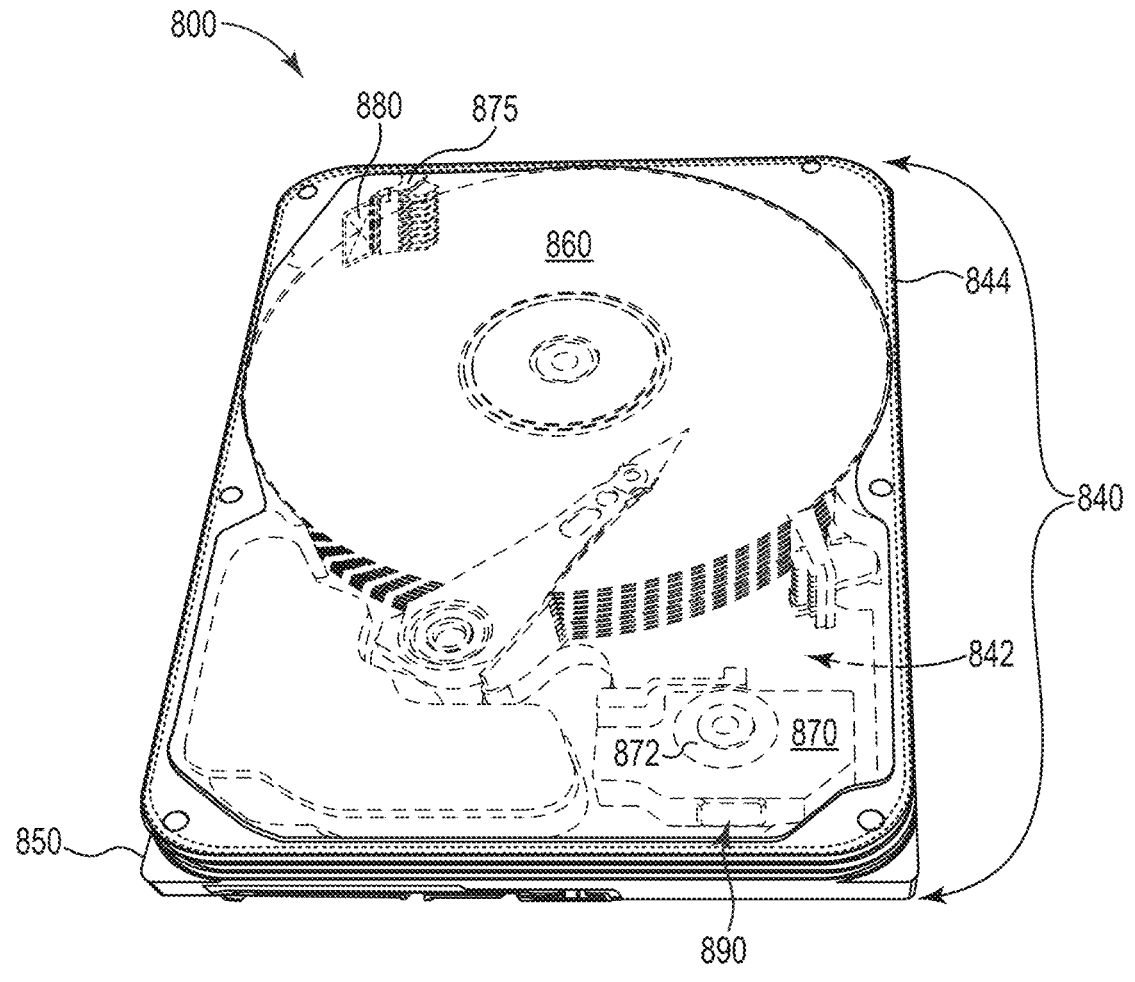
FIG. 8B is a perspective view of the hard-disk drive shown in FIG. 8A in its assembled configuration and showing interior components in broken lines.

A non-limiting example of a hard disk drive that can be use a laser diode having a mirror structure according to the present disclosure is illustrated in FIGS. 8A and 8B. Advantageously, such a hard disk drive can operate with reduced laser diode failure in the read/write head, and therefore may be commercially superior.

Data storage device 800 is illustrated as a hard-disk drive (HDD) that includes an outer enclosure or housing 840 configured to contain multiple hard-disk drive components, including electronic components. Housing 840 includes a base 850 and a cover 860 mounted to the base 850. Base 850 includes a recess or cavity 852 configured to accommodate components of data storage device 800. Base 850 can also be referred to as a motor base assembly (MBA). Data storage device 800 further includes a printed circuit board assembly (PCBA) 806. PCBA 806 of this configuration is coupled to base 850 and includes a plurality of input/output connectors 807 that are each configured to provide an interface between one or more components of data storage device 800 and one or more host devices (e.g., a computer, a server, a consumer electronic device, or the like).

Base 850 and cover 860 may be formed from any suitable material, such as metal (e.g., aluminum), plastic, or other suitable material or combinations thereof. In some embodiments, base 850 includes multiple components, such as an outer frame and a bottom cover, that are coupled together (e.g., by screws, welding, or the like).

Cover 860 is configured to couple to base 850 to enclose components of data storage device 800, as shown in FIG. 8B. As shown, cover 860 is aligned with and coupled to a surface of base 850, such as a surface 858 shown in FIG. 8A, to define an interior volume 842 of data storage device 800, which includes an interior gas space. A load/unload ramp 853 is also positioned in interior volume 842. Components other than those illustrated or specifically identified in FIGS. 8A and 8B and described herein are contemplated as being positioned within the interior volume 842, such as a preamp and/or assembly hardware, for example. Cover 860 can be coupled to the base 850 using any suitable technique, such as using one or more screws, connection fingers, locking/clipping structures, adhesives, rivets, other mechanical fasteners, welding (e.g., ultrasonic welding) or combinations thereof. In some embodiments, data storage device 800 can further include one or more seals disposed between base 850 and top cover 860 and configured to seal the interior volume 842 of data storage device 800. In some embodiments, seal 844 can be a weld formed between base 850 and cover 860, or seal 844 can be a form-in-place gasket (FIPG).

A gas or gas mixture may be added to interior volume 842 of data storage device 800. Helium, for example, may be included in interior volume 842 to reduce mechanical vibrations, particularly of head gimbal assemblies (HGAs) of data storage device 800. Helium may also be included within data storage device 800 to enable lower head-media spacing (HMS) between a reader and/or writer of a magnetic recording head and a magnetic disk, and thus a higher areal density capability (ADC) of data storage device 800. The interior gas space of the interior volume 842 may benefit from a small amount of oxygen. In some embodiments, interior gas space can have an oxygen concentration in the range from 0.1 to less than 20 mole percent, from 0.1 to 15 mole percent, or even from 3 to 15 mole percent based on the total gas in the interior gas space, with the balance being helium.

In some embodiments, data storage device 800 can be a sealed (hermetically sealed) data storage device, which can be defined by, e.g., the amount of gas (e.g., helium) that leaks from the data storage device after it has been sealed (e.g., a welded HDD). In some embodiments, a hermetically sealed data storage device having its interior gas space filled with helium gas has a nominal helium leak rate of less than 10% by volume in five years. In some embodiments, in terms of (atm cc/second), a hermetically sealed data storage device having its interior gas space filled with helium gas has a nominal helium leak rate of $10\times10^-8$ atm (atmosphere) cc (cubic centimeter)/second or less at 25° C.; $8\times10^-8$ atm cc/second or less, $5\times10^-8$ atm cc/second or less; or even $4\times10^-8$ atm cc/second or less at 25° C. As mentioned above, a form-in-place gasket can be used to help seal a data storage device.

Data storage device 800 includes an actuator 810, which includes a head stack assembly (HSA) 814 and voice coil motor 812. Head-stack assembly 814 is rotatably mounted to the base 850, and includes radially-extending arms 818 that are rotatable about an axis 819 that is perpendicular to the floor of base 850 as shown in FIG. 8A. Data storage device 800 includes one or more magnetic disks configured to store bits of data. HSA 814 further includes a plurality of head-gimbal assemblies (HGAs). Each HGA 820 includes a read/write head 830 for reading data from and writing data to a surface of a magnetic disk 808. HSA 814 can include one or more subcomponents. Non-limiting examples of such subcomponents include hookup 815 (a flex cable and a flex clamp) and/or adhesives. Other components of a read/write head 830 can be included, such as heaters, heat sinks, and piezoelectric actuators, for example.

Voice coil motor 812 produces a magnetic field that exerts a force on HSA 814, causing radially-extending arms to rotate about a shaft 816 in either rotational direction. Each radially-extending arm 818 is mechanically and rotatably coupled to shaft 816 such that as HSA 814 rotates it causes each radially-extending arm 818, and thus magnetic recording heads, to move relative to magnetic disks 808. Voice coil motor 812 includes magnets and a voice coil.

Data storage device 800 further includes a motor assembly 805 configured to rotatably support magnetic disks and circumferentially rotate magnetic disks about an axis of rotation during operation. Magnetic disks are mounted on motor assembly 805 such that an annular volume of each magnetic disk 808 encircles a portion of motor assembly 805. Further, magnetic disks are separated from each other in a stacked manner using spacers (not shown). Motor assembly 805 has an outside diameter 822 and may rotate magnetic disks during an operation of data storage device 800 such that each magnetic disk 808 moves relative to a respective read/write head 830 to enable the read/write heads to read data from and/or write data to the magnetic disk 808.

Data storage device 800 includes a diverter 875 that is proximal to magnetic disks 808. Diverter 875 is configured to divert helium and/or other interior gas mixtures(s) to reduce windage on each radially-extending arm 818, which can reduce undesired vibrations that may cause a read/write head 830 to move off track and/or contact a magnetic disk 808.

The data storage device 800 includes components having an adsorbent composition in the form an article that permits the components to be positioned and/or mounted in the interior volume 842 of data storage device 800 so that the adsorbent composition can adsorb moisture and/or organic vapors from the interior gas. In some embodiments, a component can also include filtering capability to remove organic particulate material. As shown in FIGS. 8A and 8B, non-limiting examples of such components include an environmental control module 870, a recirculation filter 880, and a label filter 890 for such a purpose. As shown, environmental control module 870 includes an inlet diffuser seal 872 helps its contents (e.g., environmental control module tablet (not shown)) dry during manufacturing. The environmental control module tablet can become exposed to the interior volume 842 of data storage device 800 by breaking the seal located at the bottom center of inlet diffuser seal 872 to create an opening (not shown) so that gas exchange can occur between the inside of environmental control module 870 and the interior volume 842.

Figure 9:
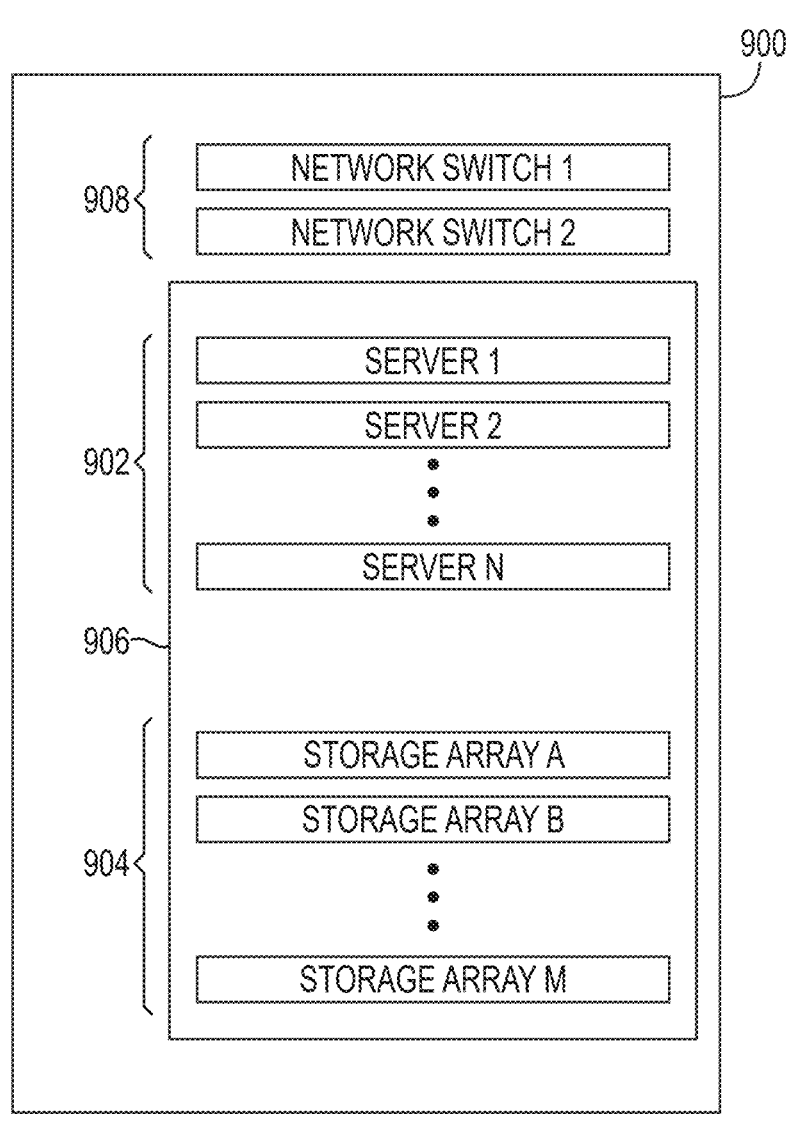
FIG. 9 is a block diagram of a data center system including a plurality of data storage devices according to the present disclosure.

FIG. 9 illustrates a non-limiting example of a computing system 900 that includes a plurality of data storge devices (e.g., data storage device 800) that include an absorbent composition according to the present disclosure. In FIG. 9, a diagram shows a computing system 900 that can have a computing enclosure used in network storage services. As shown, the computing enclosure includes a plurality of servers 902 coupled to a plurality of drive arrays 904 via a rack-level network fabric 906. Each server 902 can include at least one CPU coupled to random access memory (RAM) and an input/output (IO) subsystem. Each server 902 may have one or more dedicated power supplies (not shown) or the enclosure may provide power through a power bus (not shown). Each server 902 may also have an IO interface for connecting to the rack-level network fabric 906. The rack-level network fabric 906 may use other rack-level networking technology such as switches 908.

The drive arrays 904 may each include a separate sub-enclosure with IO busses, power supplies, storage controllers, etc. The drive arrays 904 include a plurality of individual data storage devices (e.g., HDD) densely packed into the sub-enclosure. An example of a data center that includes a computing system have a plurality of data storage devices is also described in U.S. Pat. No. 11,567,834 (Bent et al.).

What is claimed is:

1. A single-transverse-mode laser diode comprising a body, wherein the body comprises:

an active region;

a first facet;

a second facet, wherein the first facet and second facet are on opposite ends of the body, wherein the second facet is the light-exit facet; and a bowtie-shaped ridge waveguide disposed in the body and configured to confine light generated in the active region and direct light toward the light-exit facet of the body, wherein the single-transverse-mode laser diode is configured to be coupled to an apparatus to communicate light from the light-exit facet of the single-transverse-mode laser diode to a near-field transducer in the apparatus.

2. The single-transverse-mode laser diode of claim 1, wherein the bowtie-shaped ridge waveguide has a first tapered region, a second tapered region, and a constriction region disposed between the first tapered region and the second tapered region, wherein the first tapered region tapers from first facet toward the constriction region, and wherein the second tapered region tapers from second facet toward the constriction region.

3. The single-transverse-mode laser diode of claim 2, wherein at least one of the first tapered region or the second tapered region tapers linearly.

4. The single-transverse-mode laser diode of claim 2, wherein at least one of the first tapered region or the second tapered region tapers curvilinearly.

5. The single-transverse-mode laser diode of claim 2, wherein the constriction region has a width in a range from 1 to 3 microns, and a length in a range from 0 to 30 microns.

6. The single-transverse-mode laser diode of claim 2, wherein at least one of the first tapered region or the second tapered region has a length of 300 microns or less.

7. The single-transverse-mode laser diode of claim 2, wherein the first tapered region and the second tapered region each has a length of 20 microns or more.

8. The single-transverse-mode laser diode of claim 2, wherein at least one of the first tapered region or the second tapered region has a maximum width in a range from 3 to 10 microns.

9. The single-transverse-mode laser diode of claim 1, wherein the bowtie-shaped ridge waveguide has a length in range from 200 to 350 microns.

10. The single-transverse-mode laser diode of claim 1, wherein the single-transverse-mode laser diode is configured to have a power output of 200 milliwatts or less.

11. The single-transverse-mode laser diode of claim 1, wherein the single-transverse-mode laser diode is configured to operate in a fundamental transverse mode ($TE_{00}$) and produce a Gaussian beam profile.

12. The single-transverse-mode laser diode of claim 1, wherein the single-transverse-mode laser diode has an emission aperture of 10 microns or less.

13. A substrate comprising a plurality of single-transverse-mode laser diodes of claim 1.

14. An apparatus comprising:

a substrate;

a single-transverse-mode laser diode of claim 1, wherein the single-transverse-mode laser diode is encapsulated by dielectric material on the substrate; and a near-field transducer located on the substrate and optically coupled to the single-transverse-mode laser diode to receive light from the single-transverse-mode laser diode.

15. The apparatus of claim 14, wherein the apparatus is a heat-assisted magnetic recording read/write head.

16. The apparatus of claim 14, further comprising a waveguide disposed between the single-transverse-mode laser diode and the near-field transducer.

17. A data storage device comprising at least one apparatus of claim 14.

18. A computing system comprising a plurality of data storage devices of claim 17.

19. A method comprising:

providing a donor substrate that includes at least one single-transverse-mode laser diode of claim 1; and transfer printing the at least one single-transverse-mode laser diode to a mounting surface on a target substrate.

20. The method of claim 19, further comprising, after transfer printing, processing the at least one single-transverse-mode laser diode to integrate the at least one single-transverse-mode laser diode into a read/write head.

* * * * *